United States Patent [19]

Enomoto et al.

[11] 4,322,881
[45] Apr. 6, 1982

[54] METHOD FOR MANUFACTURING SEMICONDUCTOR MEMORY DEVICES

[75] Inventors: Tatsuya Enomoto, Itami; Hiroshi Shibata, Kawasaki, both of Japan

[73] Assignee: VLSI Technology Research Association, Kanagawa, Japan

[21] Appl. No.: 107,286

[22] Filed: Dec. 26, 1979

[30] Foreign Application Priority Data

Dec. 26, 1978 [JP] Japan ................................ 53-163808

[51] Int. Cl.³ ........................ H01L 29/78; B01J 17/00
[52] U.S. Cl. ..................................... 29/571; 148/1.5; 148/187; 357/59
[58] Field of Search ................. 148/1.5, 187; 29/571; 357/59

[56] References Cited

U.S. PATENT DOCUMENTS

| | | | |
|---|---|---|---|
| 4,114,256 | 9/1978 | Thibault | 29/571 |
| 4,149,307 | 4/1979 | Henderson | 29/571 |
| 4,151,537 | 4/1979 | Goldman et al. | 357/23 |
| 4,152,823 | 5/1979 | Hall | 29/571 |
| 4,163,985 | 8/1979 | Schuermeyer et al. | 357/23 |
| 4,174,252 | 11/1979 | Kressel et al. | 156/653 |
| 4,240,845 | 12/1980 | Esch et al. | 148/1.5 |

FOREIGN PATENT DOCUMENTS 20094 4/1966 Japan .

Primary Examiner—Upendra Roy

Attorney, Agent, or Firm—Sughrue, Mion, Zinn, Macpeak & Seas

[57] ABSTRACT

A method for producing semiconductor memory devices each including an MNOS-type transistor and an MNOS-type capacitor or an MOS-type transistor and an MNOS-type capacitor. A thick oxide layer is formed in predetermined patterns on the surface of the substrate so as to separate the memory cell areas. The surface of the wafer is then oxidized to form a thin oxide layer on which a layer of silicon nitride is deposited and over which a layer of polycrystalline silicon is formed. Portions of the layer of silicon nitride and layer of polycrystalline silicon are etched away in preferred patterns as are second portions of the layer of polycrystalline silicon to partially expose the layer of silicon nitride. Portions of the thin oxide layer are removed in areas where the second portions of the layer of polycrystalline silicon are etched away to thereby expose a first portion of the surface of the wafer. Following the diffusion of impurities into the wafer, a layer of thermal oxide is formed. Next, portions of the silicon nitride layer and the thin oxide layer are etched away to expose a second portion of the surface of the wafer. The wafer is again thermally oxidized to form a thin oxide film on the second portion of the surface through which contact holes are subsequently formed. A conductive interconnection pattern is then formed extending into the contact holes.

8 Claims, 17 Drawing Figures

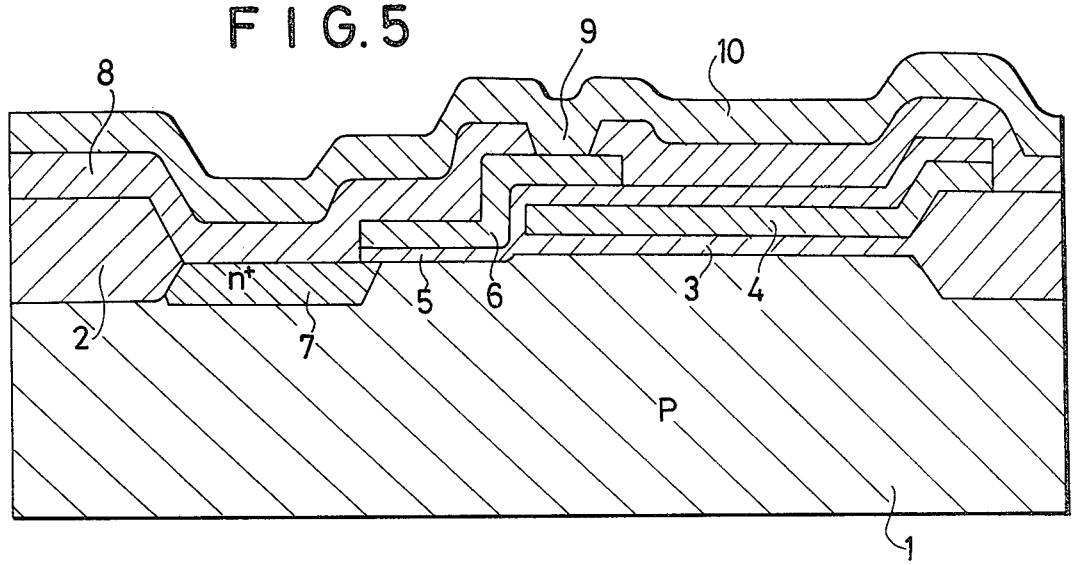
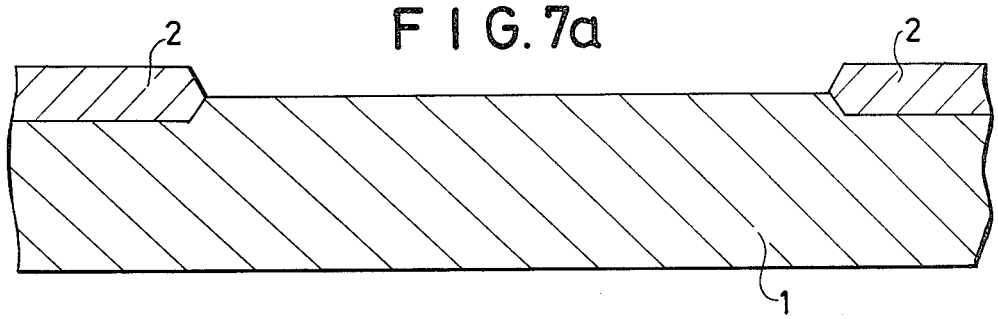
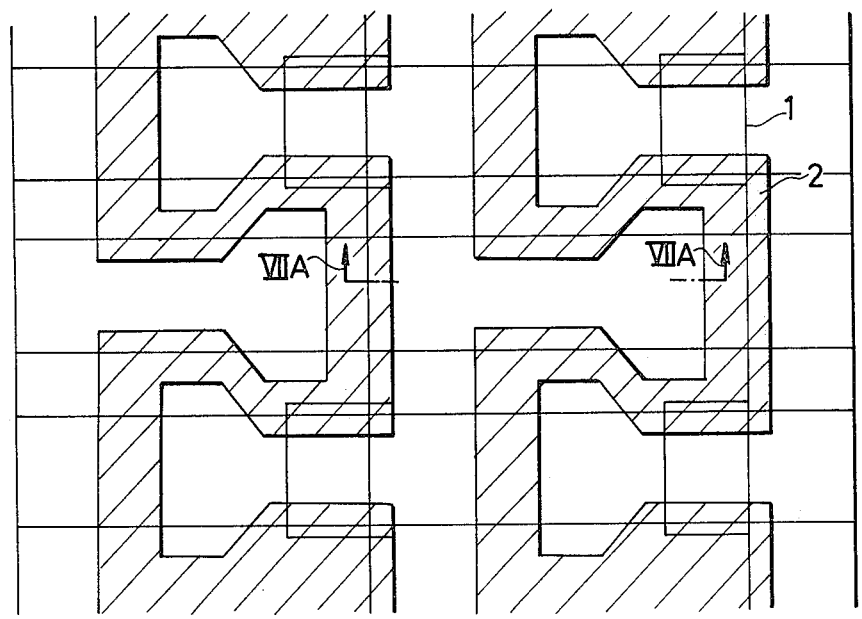

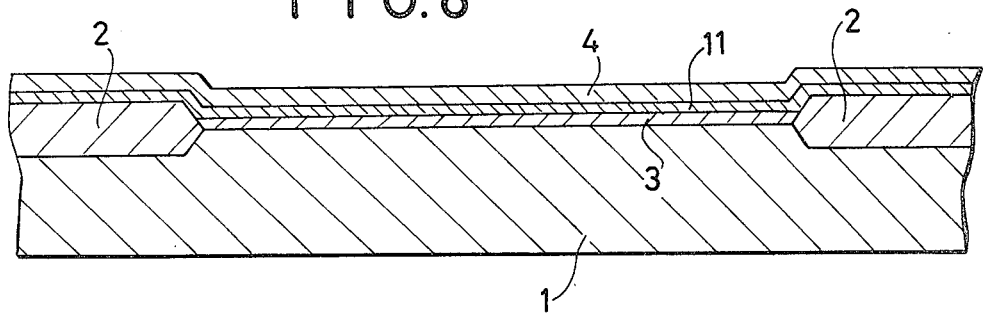
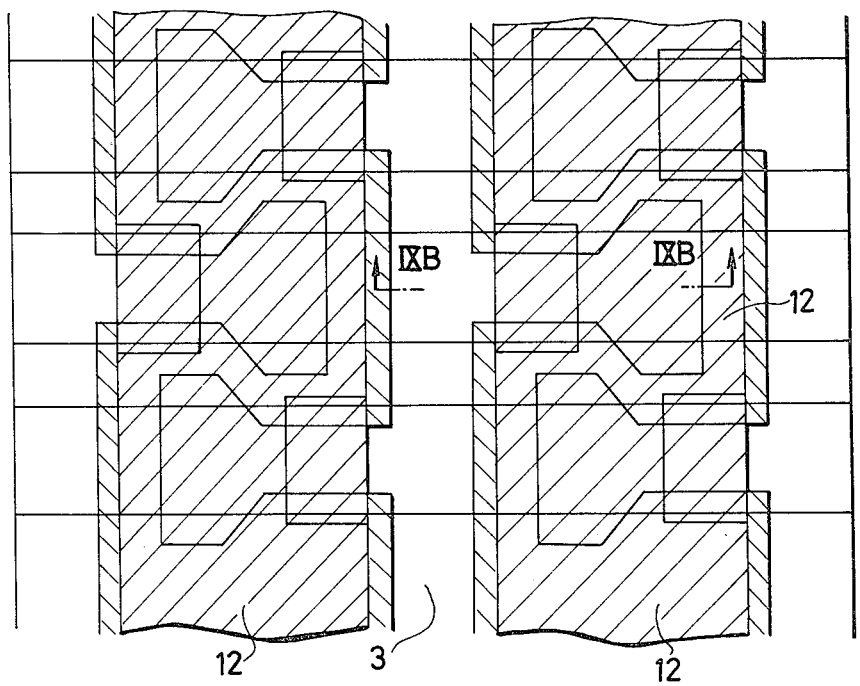
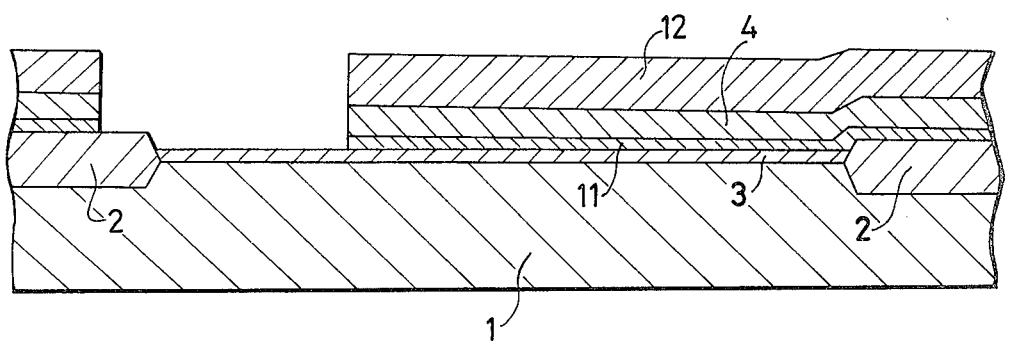

F I G. 10a
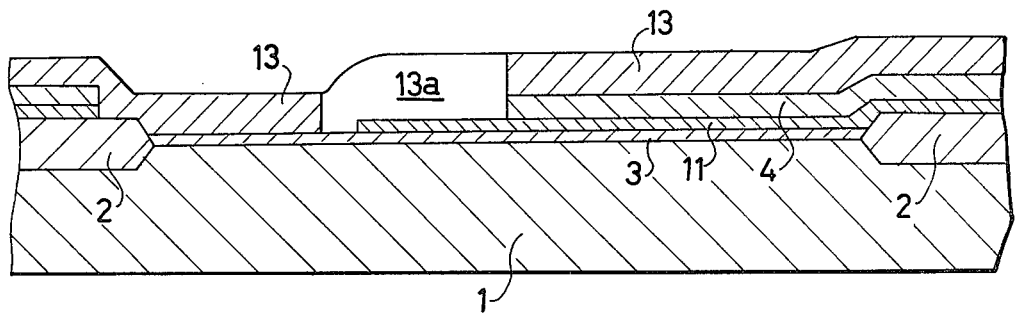
F I G. 10b
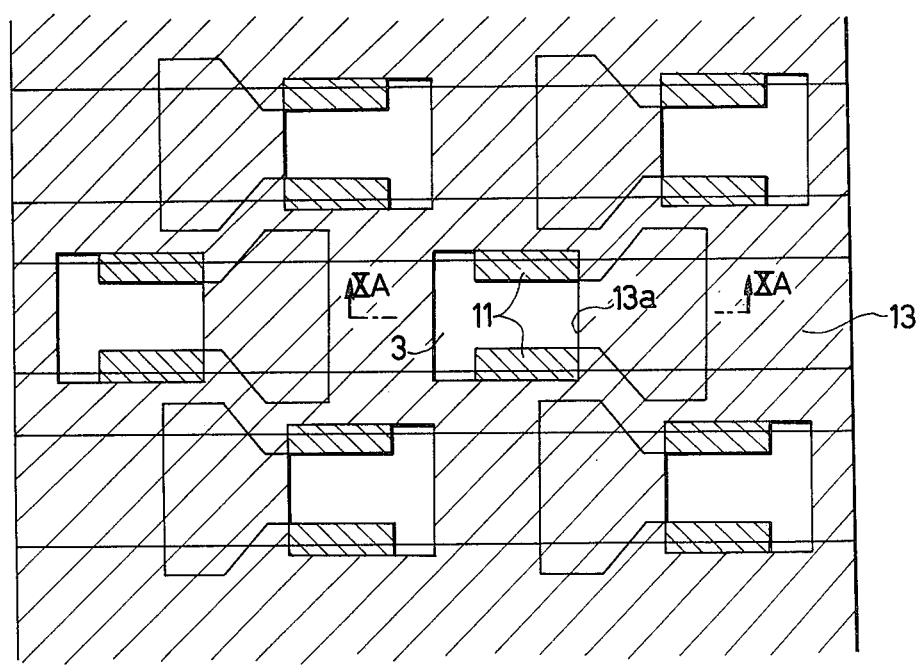
F I G. 10c
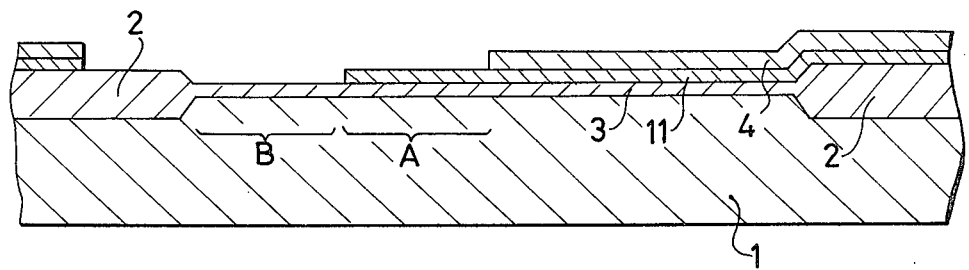

METHOD FOR MANUFACTURING SEMICONDUCTOR MEMORY DEVICES

BACKGROUND OF THE INVENTION

The present invention relates to a method for manufacturing semiconductor devices and, more particularly, to a method for manufacturing semiconductor memory devices each of which includes an MNOS-type transistor and an MNOS-type capacitor or includes an MOS-type transistor and an MNOS-type capacitor.

There are two primary types of semiconductor memory devices, a static type and a dynamic type. The static-type semiconductor memory device can generally operate at high speed. On the other hand, since the dynamic-type semiconductor memory device requires a small cell area, it is generally suitable for structuring memories of large capacity.

Recently, a dynamic-type memory element which is composed of a single transistor and a single capacitor and which has a minimum cell area has been widely used. The equivalent circuit of such a cell is shown in FIG. 1. In FIG. 1, the transistor, the capacitors, a bit line and a word line are depicted by T, C, B and W, respectively.

The conventional method of manufacturing the semiconductor memory shown in FIG. 1 will be described with reference to FIG. 2. In FIG. 2 a memory cell including an N channel MOS transistor having double crystal silicon layers and a capacitor is used as an example of the semiconductor memory element because the memory cell of the above type has wide applicability and is convenient for comparison with the present invention.

As shown in FIG. 2, a P-type silicon substrate 1 is used and thick oxide layers 2 are formed using a photographic method on portions of the surface of the substrate other than surface portions on which a drain gate and a capacitor are to be formed so as to provide electrical separation between unit elements. Following this, a thin oxide film 3 is formed on the exposed surface portion of the substrate as shown in FIG. 3. Thereafter, a polycrystalline silicon film 4 having a suitable thickness is epitaxially formed over the wafer.

In order to improve the electric conductivity of the polycrystalline silicon film 4, n-type impurities such as phosphorus are added thereto by thermal diffusion. An insulative layer 8' may be deposited on the impurity containing polycrystalline silicon layer 4 if necessary. Portions of the polycrystalline silicon film 4 and the insulative layer 8', if necessary, may be removed through a resist mask by plasma or chemical etching with portions left remaining in which the capacitor is to be formed.

After removing a portion of the oxide film 3 in an area in which a transfer transistor is to be formed, a thin oxide film 5 which is used as a gate oxide film of the transistor is formed in the same area as shown in FIG. 4. Thereafter, a polycrystalline silicon layer 6 is again formed using a method such as the CVD method to form a gate electrode of the transistor as shown in FIG. 4. Then by using the polycrystalline silicon layers 4 and 6 as masks, n-type impurities are introduced into the silicon substrate 1 by a suitable method such as thermal diffusion or ion injection to form a drain region 7.

With reference to FIG. 5, after an oxide layer 8 is formed over the entire surface of the wafer by a suitable method such as the CVD method, a contact hole 9 for the gate electrode is formed using a photographic method in the oxide film 8 through which a metal contact layer 10 formed of a material such as aluminum which is vapor deposited. Then, an interconnection layer of aluminum which is connected to the gate electrode is formed using a photographic method to obtain a word line W. FIG. 6 is a plan view of the memory cell thus produced. As shown in FIG. 6, the contact hole 9 extends over two memory cells.

It is well known that the higher the element density required in a MOS LSI device the smaller must be the size of an individual memory cell. With this requirement, the size of contact hole 9 should be made smaller as the element density increases. Unfortunately, a reduction in the size of the contact hole produces other problems. Namely, it is very difficult as a practical matter to form many small contact holes with a high precision and there is a high probability of damage to the interconnection material, that is the aluminum layers, due to the presence of a step existing at an edge portion of the contact hole. In order to eliminate the latter problem, a large amount of some material such as phosphorus may be added to the oxide layer 8 and the sharp edge portion of the contact hole may be rounded. Use of such techniques, however, enlarges the area of the contact hole thereby limiting the reduction of the cell area. Further, with a reduction of the contact hole size, the contact resistance between the polycrystalline silicon substrate and the aluminum electrode becomes large causing a degradation of the electrical characteristics of the cell.

Since a conventional memory cell has three formed layers, namely, a pair of polycrystalline silicon layers and an aluminum layer, there are many stepped portions in the cell. These stepped portions may cause damage to the interconnection layers. This is especially true when the interconnections include thin aluminum leads. In this connection, the electric insulation between the first polycrystalline silicon layer and the second polycrystalline silicon layer is relatively poor because the thickness of the oxide layer existing therebetween is at most on the same order of thickness as the gate oxide layer.

Furthermore, the capacitance between the electrodes, which should be as small as possible, is rather large. In addition to the above mentioned defects in the conventional semiconductor memory device, the thinner the thickness of the oxide layer between the first polycrystalline silicon layer and the silicon layer corresponding to the capacitor portion the larger will be the cell size. Therefore, possible small defects in the thin oxide layer may provide passage for leakage current resulting in damage to the cell.

SUMMARY OF THE INVENTION

An object of the present invention is to provide a method for manufacturing a semiconductor memory device which has no defects such as those inherent in the conventional device as described above.

Another object of the present invention is to reduce the current leakage due to the formation of the contact holes, stray capacitances between the respective electrode layers, and small defects in the gate oxide layer.

These, as well as other objects of the invention, are met by a method for producing a semiconductor memory device including the steps of providing a wafer of silicon semiconductor material containing an impurity of a first conductivity type, forming a thick oxide layer in a predetermined pattern on a surface of the wafer, thermally oxidizing the surface of the wafer to form a thin oxide layer, forming a layer of silicon nitride over at least portions of the thick oxide layer and the thin oxide layer, forming a layer of polycrystalline silicon upon the layer of silicon nitride, etching away portions of the layer of silicon nitride and first portions of the layer of polycrystalline silicon in a first predetermined pattern, etching away portions of the layer of polycrystalline silicon to partially expose the layer of silicon nitride, removing portions of the thin oxide layer in areas where second portions of the layer of polycrystalline silicon were etched away to expose a first portion of the surface of the wafer, diffusing impurity of a second conductivity type into the first portion of the surface of the wafer, providing a layer of thermal oxide on the portion of the surface which was exposed, etching away portions of the silicon nitride layer extending beyond the polycrystalline silicon layer, etching away portions of the thin oxide layer in areas where the portions of the silicon nitride layer were etched away to expose a second portion of the surface of the wafer, thermally oxidizing the wafer to form a thin oxide film on the second portion of the surface of the wafer, providing contact holes through the thin oxide layer, and forming conductive interconnection layers extending into the contact holes. In a first embodiment, the first conductivity type is the p-type. The layer of silicon nitride and the layer of polycrystalline silicon may be deposited using a CVD deposition technique. To provide the layer of thermal oxide, the wafer is preferably placed in an oxidation furnace in an oxidizing atmosphere at a pressure of greater than 1 atm. and at a temperature of at least 900° C.

If desired, a layer of silicon nitride film may be formed atop the thin oxide film. Also, if desired, a layer of polycrystalline film may be deposited prior to the step of forming the conductive interconnection layers. The conductive interconnection layers are preferably constructed of either aluminum or molybdenum which may be formed by vapor deposition.

As used herein, the terms thin and thick are used only relatively and do not stand for any particular thickness as the invention may in fact be applied using many different dimensional variations as desired.

BRIEF DESCRIPTION OF THE DRAWINGS

FIGS. 2 through 6 show steps of the conventional method for manufacturing a memory cell; and FIGS. 7 through 12 show steps of a method for manufacturing a memory cell according to the present invention.

DETAILED DESCRIPTION OF THE PREFERRED EMBODIMENTS

Figure 1:
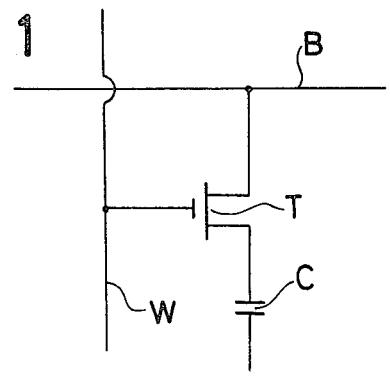
FIG. 1 is an equivalent circuit of a dynamic-type memory cell composed of a transistor and a capacitor.
Figure 2:
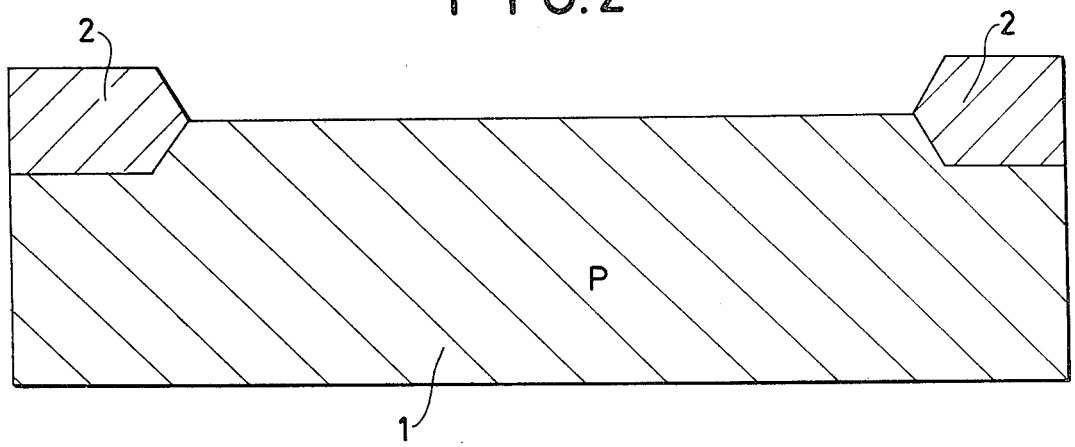
Figure 3:
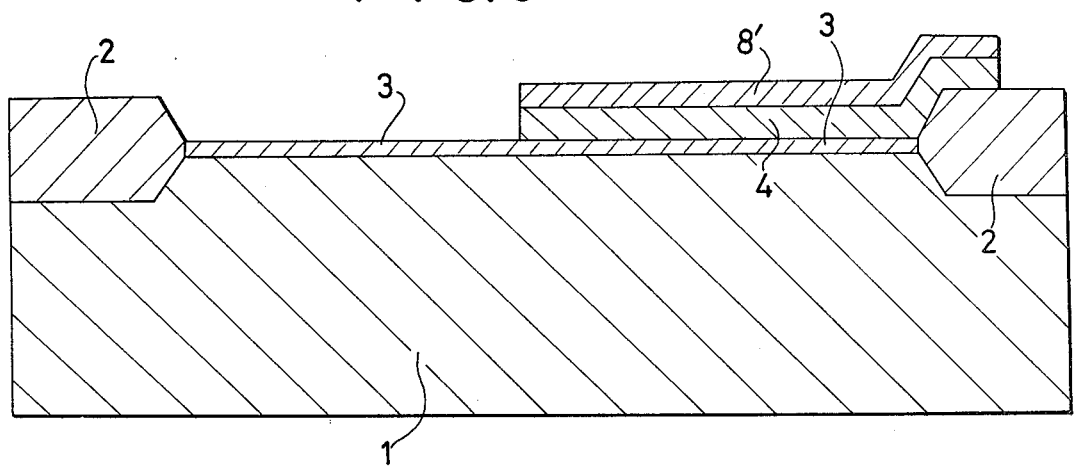
Figure 4:
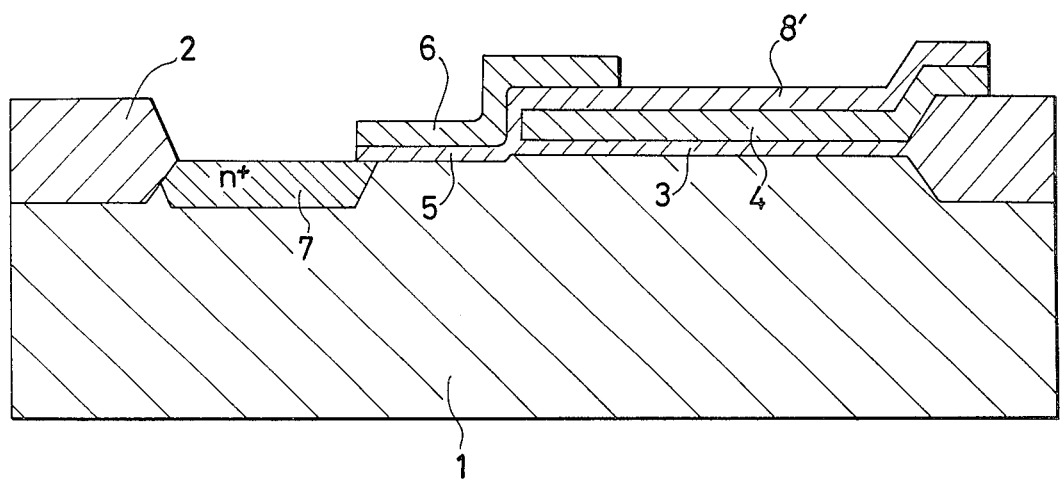
Figure 6:
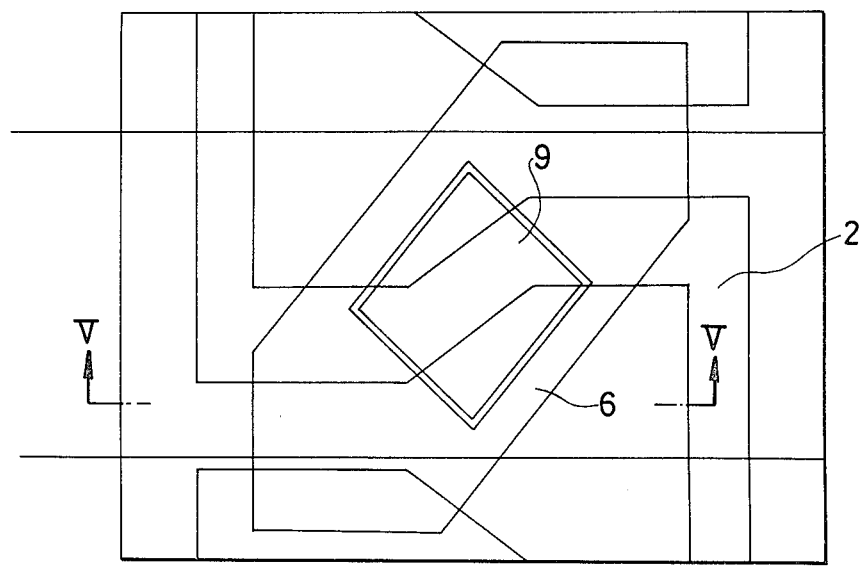

Referring now to FIG. 7a, a thick oxide film pattern 2 is formed on one surface of a p-type silicon substrate 1 to provide an electric separation between adjacent elements to be formed thereon. FIG. 7a is a plan view of the substrate 1 formed with the oxide film 2 in FIG. 7a in which hatched portions are the oxide film pattern regions.

Another oxide film 3 which becomes an insulative layer for a capacitor portion of the memory cell is formed by thermal oxidation of its entire surface. Then silicon nitride ($Si_3N_4$) layer 11 is deposited thereon using the CVD method and a polycrystalline silicon layer 4 is further formed on the silicon nitride layer 11 also by using the CVD method as shown in FIG. 8.

Therefore, a photoresist pattern 12 as shown in FIGS. 9a and 9b is formed using photographing techniques. Portions of the polycrystalline silicon layer 4 and the silicon nitride layer 11 which are not covered by the resist 12 are removed as shown by plasma or chemical etching. Then, the photoresist layer is suitably removed.

Next, a photoresist pattern having openings 13a is formed using photographic techniques as shown in FIGS. 10a and 10b. By using the photoresist pattern 13 as a mask, the polycrystalline silicon layer 4 is removed by plasma etching or another technique to partially expose the silicon nitride layer 11 resulting in the provision of polycrystalline silicon electrodes for capacitors.

The thin oxide layer 3 on bit lines shown by B in FIG. 10c is removed by using a suitable acid such as hydrofluoric acid and then n-type impurities such as phosphorus are added to the silicon substrate 1 and the polycrystalline silicon layer 4 by thermal diffusion. At this time, regions shown by A in FIG. 10c are masked by the silicon nitride layer 11 and the oxide layer 3 and to prevent the introduction of impurities thereto.

Figure 11:
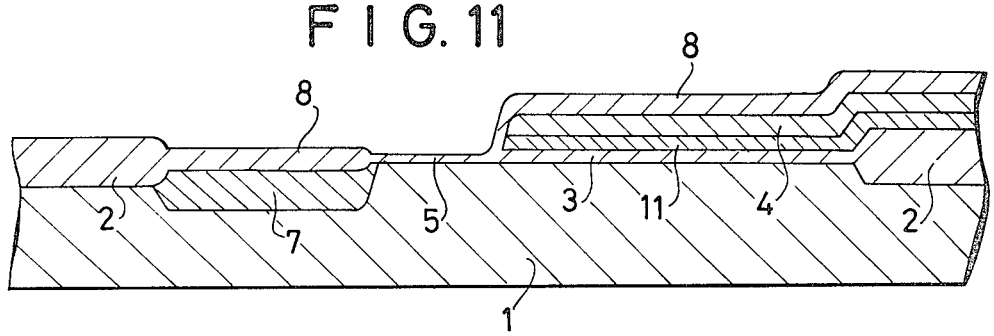

After a sufficient electrical conductivity has been provided in the diffusion layer 7 and the polycrystalline silicon layer 4, the silicon substrate is treated in a high pressure, low temperature oxidation furnace to produce an oxide layer 8 as shown in FIG. 11. In this case, the oxide layer 8 may be formed ordinary thermal oxidation. However, it is preferable to form the layer 8 in an oxidizing ambient higher in pressure than 1 atm. at a temperature at or lower than 900° C. under which the growth speed of oxide film is relatively high. That is, under these conditions, a further diffusion of the impurities such as phosphorus previously added to the silicon substrate during the high temperature oxidation, degradation of the silicon nitride film quality and crystal defects due to thermal stress between the silicon and the oxide film are prevented from occuring. Furthermore, with the heat treatment in the low temperature oxidizing ambient, it is expected that mobile hydrogen ions, which may be present in significant concentrations in the silicon nitride layer 11, would be attracted by oxygen thereby improving the quality of the silicon nitride layer. Therefore, improvements in the quality and stability of the insulating layer have been made. At this time, thick oxide layers are formed on the diffusion line (bit line) and the polycrystalline silicon layer and there is substantially no oxide layer formed on the silicon nitride layer.

Then, portions of the silicon nitride layer 11 shown by A in FIG. 10c are removed by chemical or plasma etching after which the oxide layer 3 beneath the layer 11 is chemically etched away. Then, the silicon substrate is thermally oxidized to form a thin oxide film 5 on the region A. It is possible to form on the thin oxide film 5 a silicon nitride film by the CVD method if necessary. If the silicon nitride layer and the oxide layer which were used in the previous oxidation process are highly stable, they may be used as the gate insulation layer for the transfer gate transistor.

Then, in order to provide interconnections to the various gates, sources and drains to be so-called peripheral circuits such as transistor circuits provided for driving the memory cells, discrimination circuits and amplifier circuits, contact holes are formed using a photographic technique in the oxide layer 8 on which a metal layer 10 such as aluminum or molybdenum is afterwards vapor-deposited.

Figure 12A:
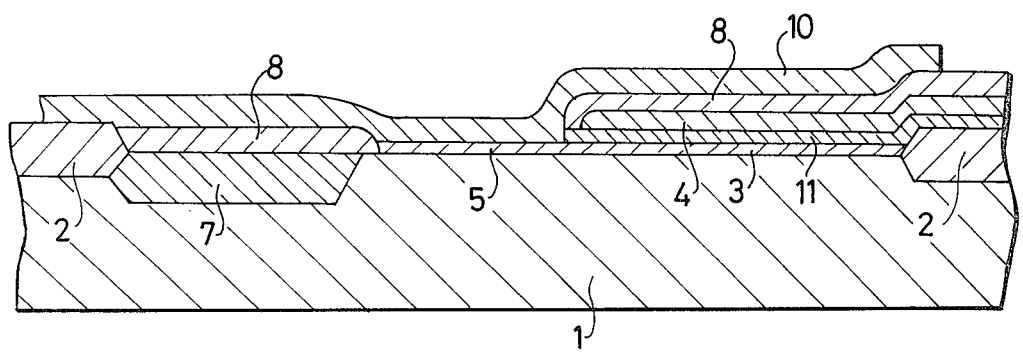
Figure 12B:
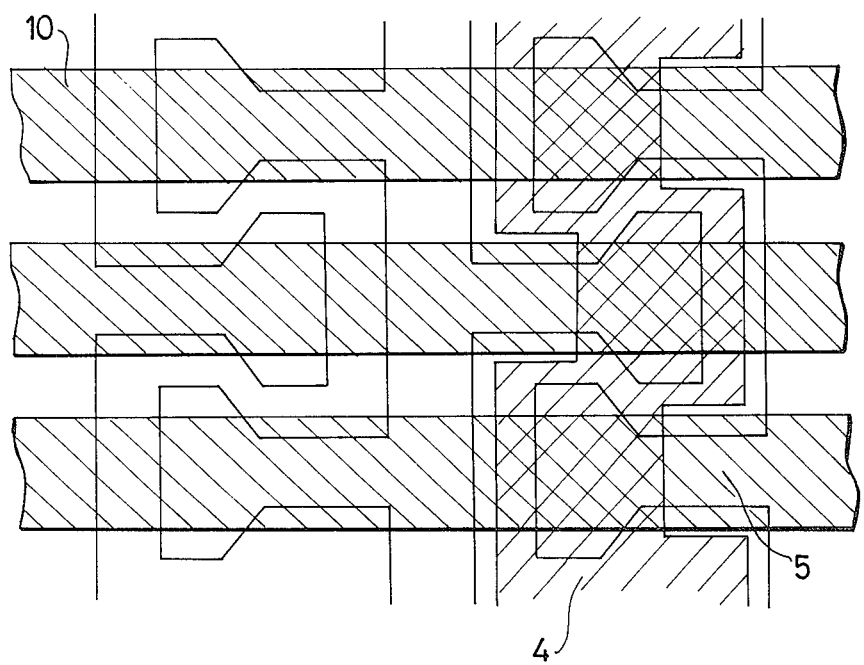

Interconnections for the gate electrodes, word leads and other connections to the peripheral circuits are formed simultaneously by using a photographic printing technique as shown in FIGS. 12a and 12b. In this case, it may be possible to first form instead of the metal layer of polycrystalline silicon film on the layer 8 by the CVD method and then to form metal interconnections running to the peripheral circuits. The fundamental meritorious effects of the present invention are not varied either way.

The formation of transistors of the peripheral circuits can be performed such that the polycrystalline silicon layer used for the formation of capacitors is employed at the gate electrode. Alternatively, when the transistor of the peripheral circuit utilizes a metal gate, it may be formed simultaneously with the formation of the transfer gate of the memory.

An IC memory constructed in accordance with the present invention possesses the following advantages in comparison with a memory having the conventional structure. Namely, since the capacitor insulating layer between the first polycrystalline silicon layer and the silicon substrate can be formed by the silicon oxide layer and the silicon nitride layer a thin film is obtained in which there is very little leakage current and with a high degree of insulation. Since the dielectric constant of silicon nitride is about twice that of the silicon oxide layer it is possible to provide a higher capacitance per unit area for the same thickness of the silicon nitride layer as that of the silicon oxide layer.

Further, since a sufficiently thick oxide layer can be formed using the silicon nitride layer as the mask for oxidation during the oxide layer formation on the diffusion layer and the polycrystalline silicon layer, the insulation between layers is improved and the inter-layer capacitance is reduced resulting in a higher speed of operation of the device.

In addition to the above mentioned advantages, since the interconnection for the word leads connected to the gate electrode of the transistor of the transfer gate is formed simultaneously with the formation of the electrodes, there is no need for providing contact holes as in the conventional device.

As will be clear from the foregoing, the method of the present invention is very effective when a memory cell is to be incorporated in a large scale, high density integrated circuit when the permissible area of the cell is very limited making it difficult to form contact holes and/or when the width of the word interconnections and the space therebetween are very small.

What is claimed is:

1. A method for producing a semiconductor memory device comprising the steps of:
    providing a wafer of silicon semiconductor material containing an impurity of a first conductivity type;
    forming a thick oxide layer in a predetermined pattern on a surface of said wafer;
    thermally oxidizing said surface to form a thin oxide layer;
    forming a layer of silicon nitride over at least portions of said thick oxide layer and said thin oxide layer;
    forming a layer of polycrystalline silicon upon said layer of silicon nitride;
    etching away first portions of said layer of silicon nitride and first portions of said layer of polycrystalline silicon in a predetermined pattern;
    etching away second portions of said layer of polycrystalline silicon to partially expose second portions of said layer of silicon nitride;
    removing first portions of said thin oxide layer in areas where said first portions of said layer of polycrystalline silicon was etched away to expose first portions of said surface of said wafer;
    diffusing impurities of a second conductivity type into said first portions of said surface;
    providing a layer of thermal oxide on said surface of said wafer by using said second portions of said layer of silicon nitride as a mask for oxidation;
    etching away said second portions of said silicon nitride layer extending beyond said polycrystalline silicon layer;
    etching away portions of said thin oxide layer in areas where said second portions of said silicon nitride layer were etched away to expose a second portion of said surface of said wafer;
    thermally oxidizing said wafer to form a thin oxide film on said second portion on said surface;
    providing contact holes through said layer of thermal oxide; and
    forming conductive interconnection layers extending into said contact holes.

2. A method for producing a semiconductor memory device comprising the steps of:
    providing a wafer of silicon semiconductor material containing an impurity of a first conductivity type;
    forming a thick oxide layer in a predetermined pattern on a surface of said wafer;
    thermally oxidizing said surface to form a thin oxide layer;
    forming a layer of silicon nitride over at least portions of said thick oxide layer and said thin oxide layer;
    forming a layer of polycrystalline silicon upon said layer of silicon nitride;
    etching away first portions of said layer of silicon nitride and first portions of said layer of polycrystalline silicon in a predetermined pattern;
    etching away second portions of said layer of polycrystalline silicon to partially expose second portions of said layer of silicon nitride;
    removing first portions of said thin oxide layer in areas where said first portions of said layer of polycrystalline silicon was etched to expose first portions of said surface of said wafer;
    diffusing impurities of a second conductivity type into said first portions of said surface;
    providing a layer of thermal oxide on said surface of said wafer by using said second portions of said layer of silicon nitride as a mask for oxidation;
    providing contact holes through said layer of thermal oxide; and
    forming conductive interconnection layers extending into said contact holes.

3. The method of claim 1 or 2 wherein said first conductivity type is p-type.

4. The method of claim 1 or 2 wherein said step of forming said layer of silicon nitride comprises CVD deposition of silicon nitride.

5. The method of claim 1 or 2 wherein said step of forming said layer of polycrystalline silicon comprises CVD deposition of polycrystalline silicon.

6. The method of claim 1 or 2 wherein said step of providing said layer of thermal oxide comprises placing said wafer in an oxidation furnace in an oxidizing atmosphere at a pressure of greater than 1 atm. and at a temperature of at least 900° C.

7. The method of claim 1 further comprising the step of forming a layer of a silicon nitride film on said thin oxide film.

8. The method of claim 1 or 2 further comprising the step of forming a layer of polycrystalline film prior to said step of forming said conductive interconnection layer.

* * * * *